United States Patent
Hamamoto (10) Patent No.: US 6,205,163 B1
(45) Date of Patent: Mar. 20, 2001

(54) SINGLE-TRANSVERSE-MODE 1×N MULTI-MODE INTERFEROMETER TYPE SEMICONDUCTOR LASER DEVICE

(75) Inventor: Kiichi Hamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/135,054

(22) Filed: Aug. 18, 1998

(30) Foreign Application Priority Data

Aug. 18, 1997 (JP) ................................. 9-221424

(51) Int. Cl.[7] ................. H01S 5/00; G02B 6/26; G02B 6/42
(52) U.S. Cl. ................. 372/43; 372/45; 372/47; 385/17; 385/28
(58) Field of Search ................. 372/43, 45, 47; 385/17, 28

(56) References Cited

U.S. PATENT DOCUMENTS

| | | | |
|---|---|---|---|
| 4,827,482 | 5/1989 | Towe et al. | 372/44 |
| 5,475,776 | * 12/1995 | Jenkins et al. | 385/28 |
| 5,799,119 | * 8/1998 | Rolland et al. | 385/28 |
| 5,949,931 | * 9/1999 | Kitamura | 385/28 |

FOREIGN PATENT DOCUMENTS

| | | |
|---|---|---|
| WO 92/11550 | * 7/1992 | (GB) . |
| 62-235794 | 10/1987 | (JP) . |
| 2-68975 | 3/1990 | (JP) . |
| 6-503902 | 4/1994 | (JP) . |
| 6-235833 | 8/1994 | (JP) . |
| WO 92/11550 | 7/1992 | (WO) . |
| WO 96/13084 | 5/1996 | (WO) . |

OTHER PUBLICATIONS

Hamamoto et al, Apr. 1997, Royal Institute of Technology, PD5–1–PD5–4.*
Patrick Vankwikelberge et al., "Local Normal Mode Analysis of Index–Guided AlGaAs Lasers with Mode Filter", *IEEE Journal of Quantum Electronics*, vol. QE–23, No. 6, Jun. 1987, pp. 730–737.
L. J. Mawst et al., "Resonant self–aligned–stripe antiguided diode laser array", *Appl. Phys. Lett.*, vol. 60, No. 6, Feb. 10, 1992, pp. 668–670.
Lucas B. Soldano et al., "Optical Multi–Mode Interference Devices Based on Self–Imaging: Principles and Applications", *Journal of Lighwave Technology*, vol. 13, No. 4, Apr. 1995, pp. 615–627.
Kiichi Hamamoto et al., "Single–transverse–mode active–MMI 1.5μm–InGaAsP buried–hetero laser diode", *ECIO '97*, Apr. 1997, pp. PD5–1–PD–4.
Soldano et al., "Optical Multi–Mode Interference Devices Based on Self–Imaging: Principles and Applications", *Journal of Lightwave Technology*, vol. 13, No. 4, Apr. 1, 1995, pp. 615–627.
K. Hamamoto et al., "Single transverse mode active multimode interferometer InGaAsP/InP laser diode", *Electronics Letters*, vol. 34, No. 5, Mar. 5, 1998, pp. 462–464.

* cited by examiner

Primary Examiner—Frank G. Font
Assistant Examiner—Armando Rodriquez
(74) *Attorney, Agent, or Firm*—Sughrue, Mion, Zinn. Macpeak & Seas, PLLC

(57) ABSTRACT

In a semiconductor laser device, a first section including a single-mode waveguide and a second section including N (N=2, 3 . . . ) single-mode waveguides are provided. A third section including a 1×N multi-mode interference type waveguide is provided and has an end connected to the first section and has another end connected to the second section.

4 Claims, 9 Drawing Sheets

Fig. 1

$\lambda = 1.5 \mu m$

SINGLE-TRANSVERSE-MODE 1×N MULTI-MODE INTERFEROMETER TYPE SEMICONDUCTOR LASER DEVICE

BACKGROUND OF THE INVENTION

1. Field of the Invention

The present invention relates to a semiconductor laser device, and more particularly, to a single transverse-mode semiconductor laser device or laser diode (LD) having an optical waveguide structure providing high optical output characteristics.

2. Description of the Related Art

In today's world, optoelectronic technologies have achieved a remarkable development and have found a variety of applications including those of recording/reproducing information such as compact disks (CDs) and those of optical communication that uses optical fibers. Various LDs have beeen developed in the course of the development of optoelectronic technologies. For instance, semiconductor laser diodes adapted to near infrared or visible light are used for CDs, whereas those adapted to a large wavelength band are used for optical communication. Thus, LDs take a significant part in the optoelectronic technology.

Among LDs that are currently available and structurally differentiated, waveguide type LDs typically have a configuration adapted to a single-transverse-mode waveguiding. CDs are required to have a high recording density in order to store a large volume of data and a single-transverse-mode laser beam has to be used for recording data densely. Moreover, for optical communication, the use of a multi-mode signal beam is not suitable for long distance transmission because of the adverse effect of multi-mode dispersion so that waveguide LDs adapted to emit a single-transverse-mode laser beam are generally used.

In order to produce a single-transverse-mode beam, a single mode waveguide that has a limited width and is adapted to cut off any multi-mode beam is typically used for the waveguide of an LD. More specifically, the width of the active layer of the waveguide of the LD is limited to about 2 to 4 $\mu$m. Thus, only a small electric current can be injected into the LD which results in limiting the optical output of the LD. One of the simplest ways to inject a large electric current and improve the saturated optical output is to use a waveguide having a large width for the LD. However, this technique contradicts the restrictions for realizing a single-transverse-mode waveguide as described above, so that the output level of an LD has so far been limited for technical reasons. Various solutions have been proposed to solve this problem.

A first prior art LD uses a wide mode-filter integrated multi-mode waveguide to form a major optical excitaion region to improve the saturated optical output. The multi-mode waveguide excites not only a single mode beam but also higher order mode beams such as a first-order mode beam and a second-order mode beam; in this case, the higher order mode beams are extracted by the mode filter (see P. Vankwikelberge et al., "Local Normal Mode Analysis of Index-Guided AlGaAs Lasers with Mode Filter", IEEE Journal of Quantum Electronics, Vol. QE-23, No. 6, pp. 730–737, June 1987).

However, since neither the optical energy of the first-order mode beam nor the optical energy of the second-order mode beam contribute to the optical output of the single mode beam, this first prior art LD shows a poor efficiency of transforming electric energy into optical energy if compared with the conventional single mode LD.

A second prior art LD uses a phase-locked semiconductor laser diode array where a plurality of semiconductor laser diodes, such as 20 semiconductor laser diodes, are arranged with a certain spacing perpendicular to the direction of an optical waveguide to cause resonance in order to generate a high single mode output level. In this case, theoretically more than 20 semiconductor laser diodes can be arranged (see L. J. Mawst et al., "Resonant self-aligned-stripe anti-guided diode laser array", Appl. Phys. Lett. 60 (6), pp. 668–670, Feb. 10, 1992).

In the second prior art LD, however, since it is structurally complex, it is difficult to manufacture such LDs at a high manufacturing yield. Additionally, the structure has little tolerance for satisfying the resonance-related requirements and hence it is difficult to manufacture such LDs with an enhanced level of reproducibility.

SUMMARY OF THE INVENTION

It is an object of the present invention to provide a semiconductor laser device that has a simple configuration and can be manufactured in a simple manner to generate a single-transverse-mode beam with an enhanced output level.

According to the present invention, in a semiconductor laser device for outputting a laser beam in a single transverse mode, an optical waveguide structure including a 1×N (N=2, 3, . . . ) multi-mode interference type optical waveguide is provided.

BRIEF DESCPIPTION OF THE DRAWINGS

The present invention will be more clearly understood from the description as set forth below, with reference to the accompanying drawings, wherein.

DESCRIPTION OF THE PREFERRED EMBODIMENTS

Figure 1:
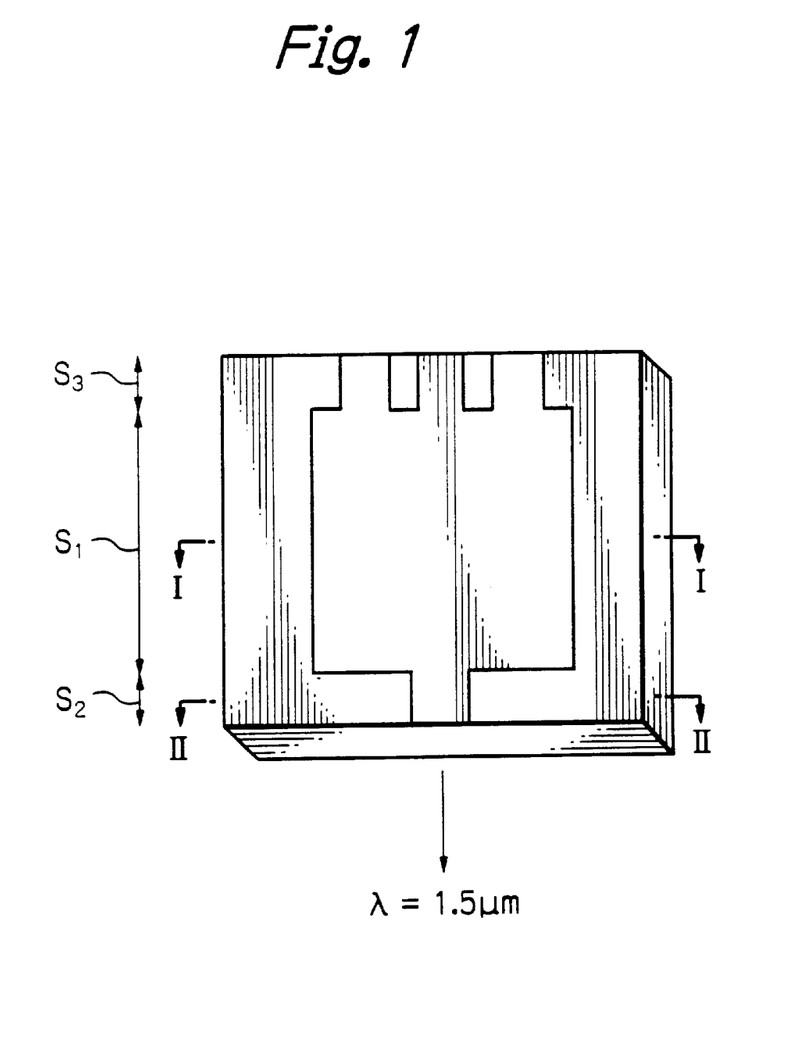
FIG. 1 is a perspective view illustrating an embodiment of the semiconductor laser device according to the present invention.

In FIG. 1, which is a perspective view illustrating an embodiment of the present invention, a semiconductor laser device having a 1.5 $\mu$m band is illustrated. The semiconductor laser device is divided into three waveguide sections $S_1$, $S_2$ and $S_3$. In this case, the multi-mode waveguide section $S_1$ is arranged between the single-mode waveguide sections $S_2$ and $S_3$. The multi-mode waveguide section $S_1$ is about 280 $\mu$m long, and each of the single-mode wave guide sections $S_2$ and $S_3$ is about 50 $\mu$m, to make the total length of the device equal to about 380 $\mu$m.

The multi-mode waveguide section $S_1$ is designed as a 1×3 multi-mode interferometer (MMI).

Figure 2A:
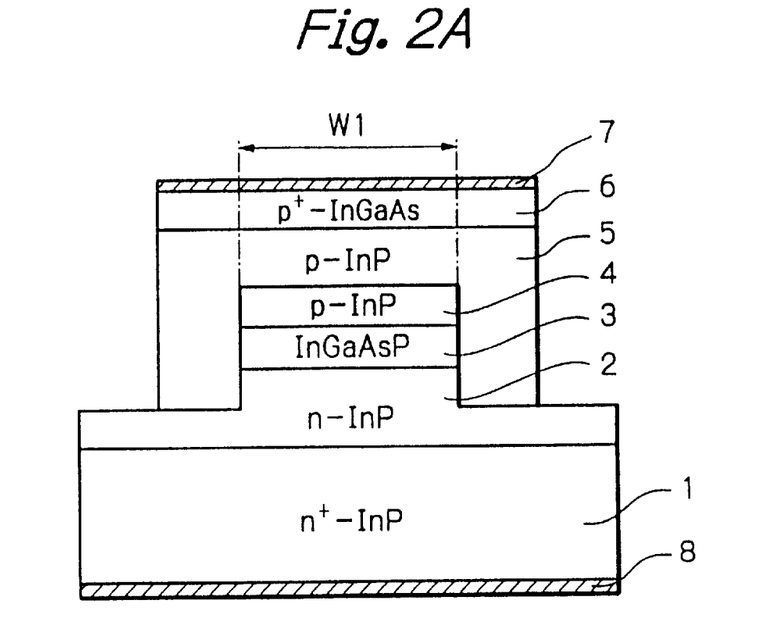
FIGS. 2A and 2B are cross-sectional views taken along the lines I—I and II—II, respectively, of FIG. 1.
Figure 2B:
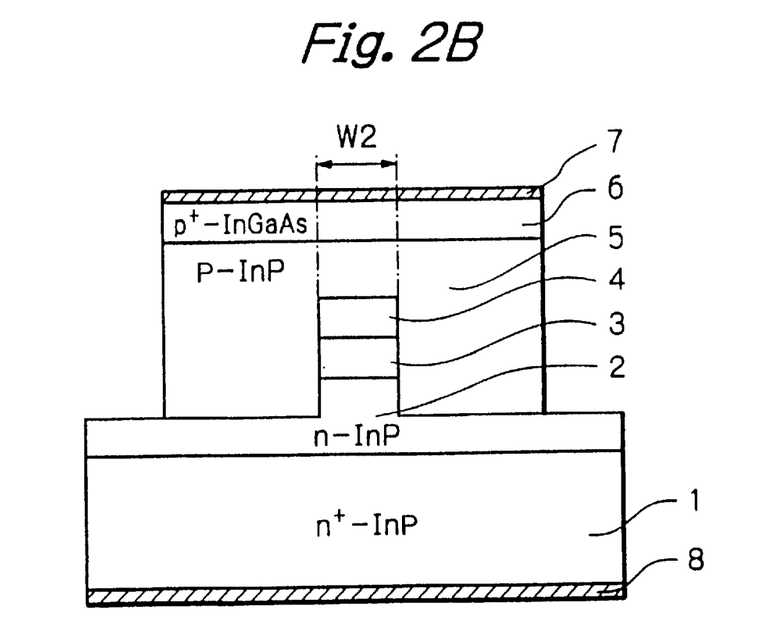

As illustrated in FIGS. 2A and 2B, which are cross-sectional views taken along the lines I—I and II—II, respectively, of FIG. 1, the layered structure as a illustrated in FIG. 2A is the same as the layered structure as illustrated in FIG. 2B, and the only difference therebetween is in the width of the waveguide. For example, the width W1 of the waveguide of the multi-mode waveguide section $S_1$ is about 18 $\mu$m, and the width W2 of the waveguide of the single-mode waveguide sections $S_2$ and $S_3$ is about 2 $\mu$m.

In FIGS. 2A and 2B, reference numeral 1 designates an n+-type InP substrate. Also, an n-type InP buffer 2, an InGaAsP active layer 3 and a p-type InP clad layer 4 are formed on the InP substrate 1. In addition, a p-type InP burying layer 5 and a p+-type InGaAs cap layer 6 are formed thereon. Further, a p-type electrode 7 and an n-type electrode 8 are formed on the front and back surfaces, respectively.

Figure 3:
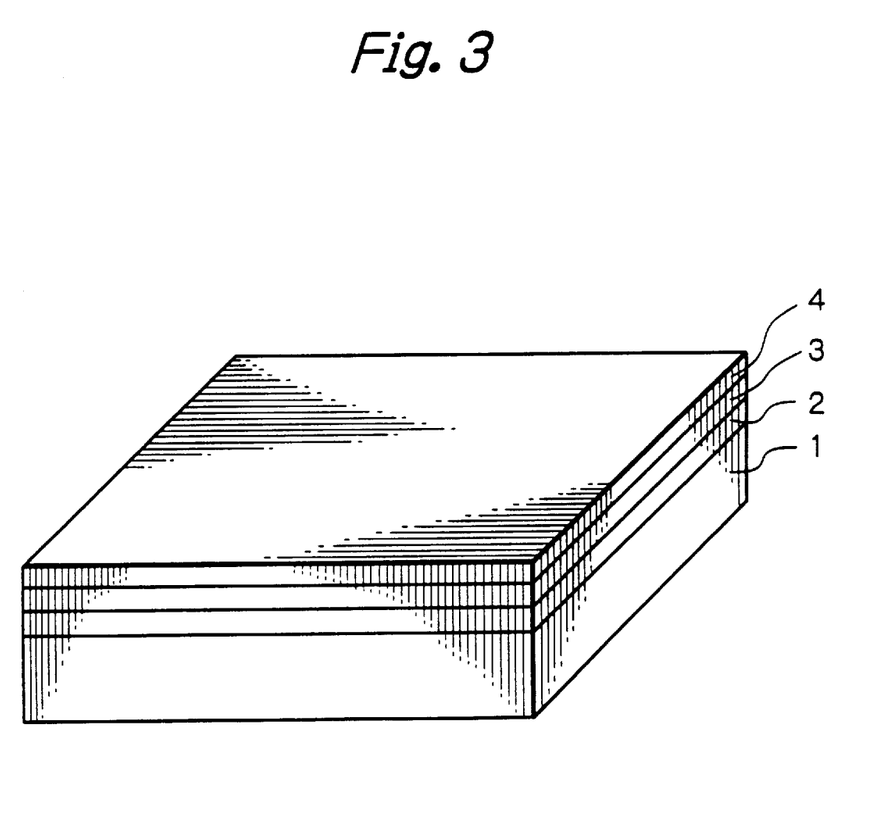
FIGS. 3, 4, 5, 6 ,7 and 8 are diagrams for explaining the method for manufacturing the semiconductor laser device of FIG. 1.

The method for manufacturing the device of FIGS. 1, 2 and 3 is explained next with reference to FIGS. 3, 4, 5, 6, 7 and 8.

First, referring to FIG. 3, an about 100 nm thick InP buffer layer 2, an about 100 nm thick InGaAsP active layer 3 ($\lambda$=1.5 $\mu$m), and an about 200 nm thick p-type InP clad layer 4 are sequentially grown on an n+- type InP substrate 1 by using a metalorganic vapor phase epitaxial (MOVPE) process.

Figure 4:
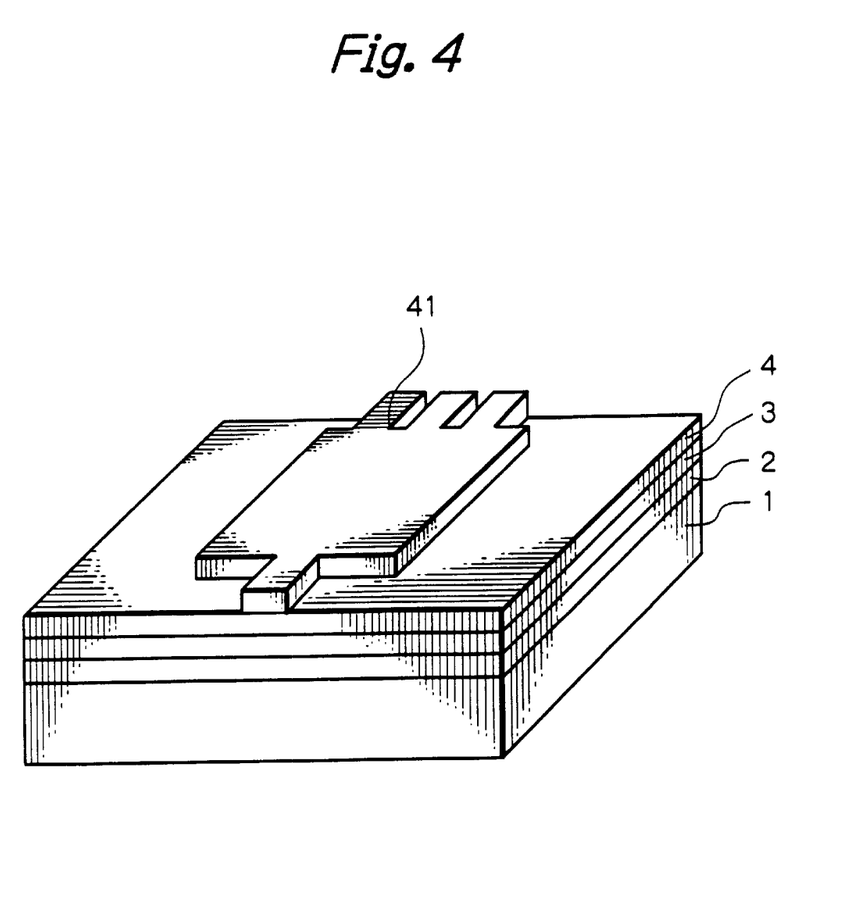
Figure 5:
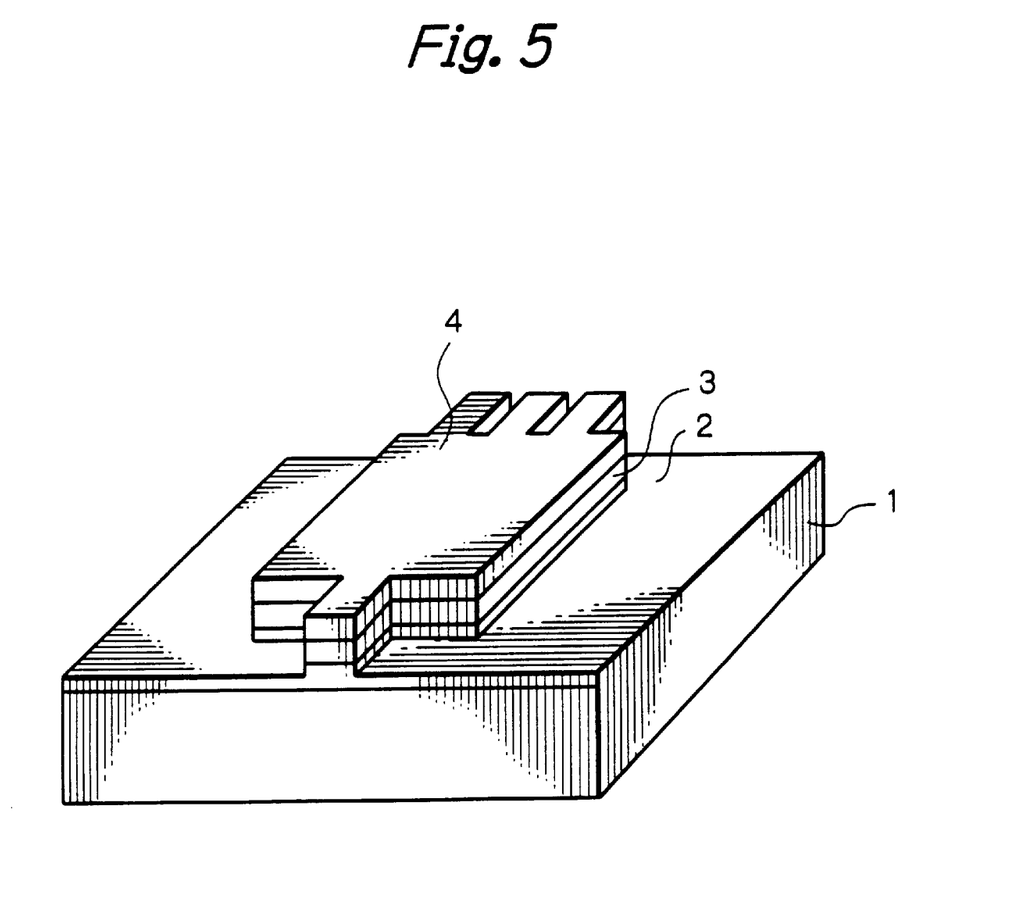

Next, referring to FIG. 4, an etching mask 41 is formed by using a photolithography and etching process. Then, the p-type clad layer 4, the InGaAsP active layer 3 and the n-type buffer layer 2 are removed by a reactive ion etching (RIE) process using the etching mask 41. As a result, a mesa structure as illustrated in FIG. 5 is obtained.

Figure 6:
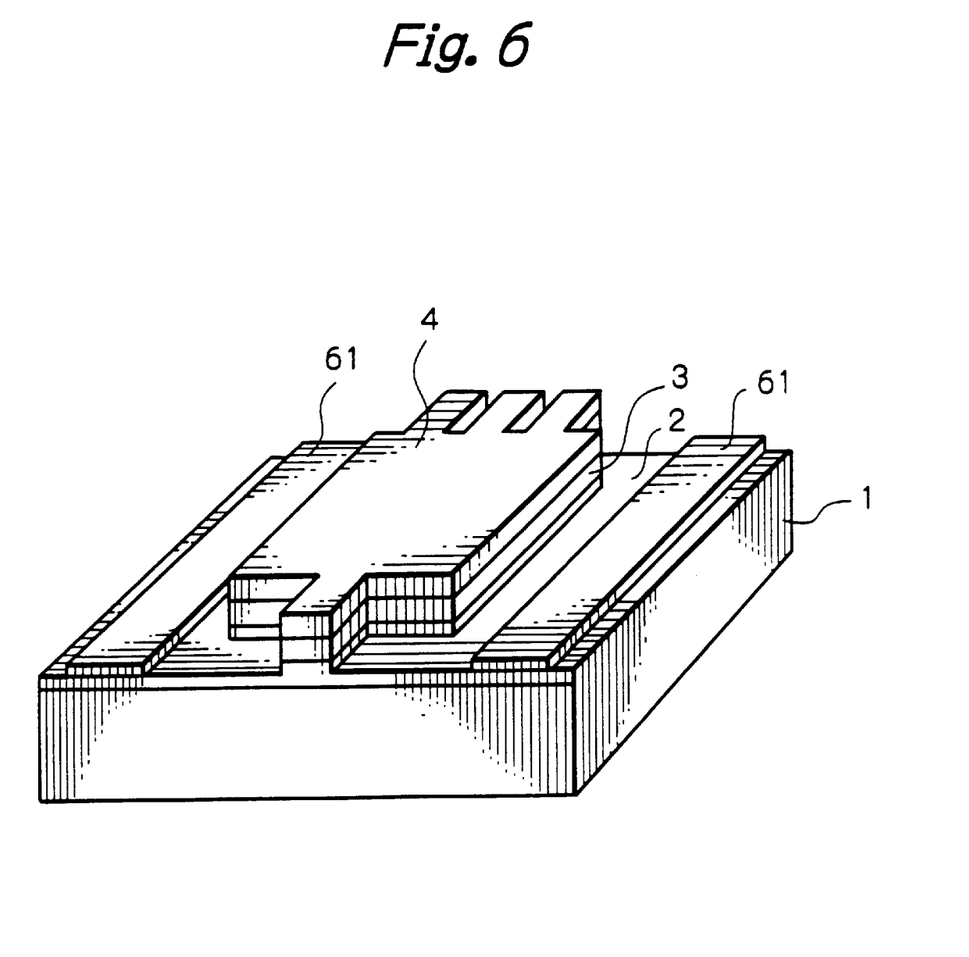
Figure 7:
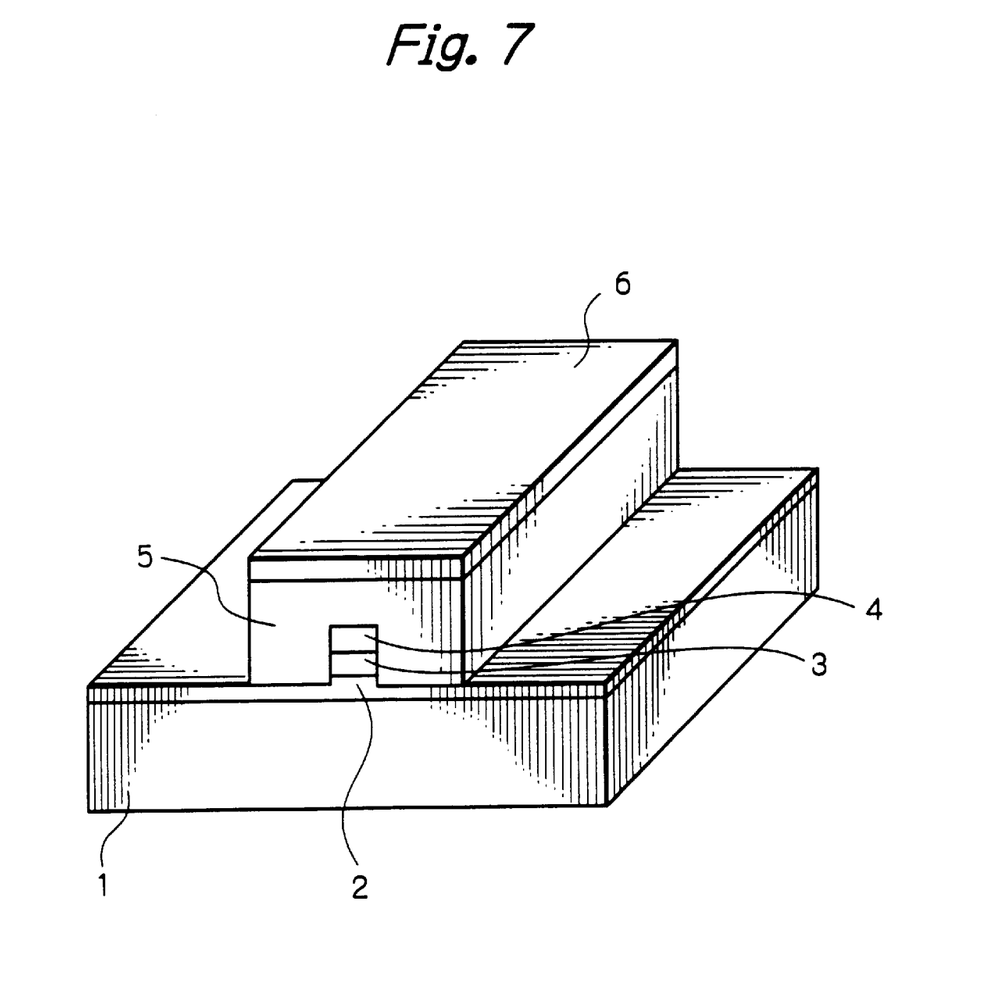

Next, referring to FIG. 6, a silicon oxide layer is deposited on the entire surface by a thermal chemical vapor deposition (CVD) process, and is patterned to form a silicon oxide mask layer 61 along the lateral side of the mesa structure. Then, an about 2 $\mu$m thick p-type InP burying layer 5 and an about 200 nm thick p-type InGaAs cap layer 6 are sequentially grown by using an MOVPE process. Then, the silicon oxide mask layer 61 is removed, and the device as illustrated in FIG. 7 is obtained.

Figure 8:
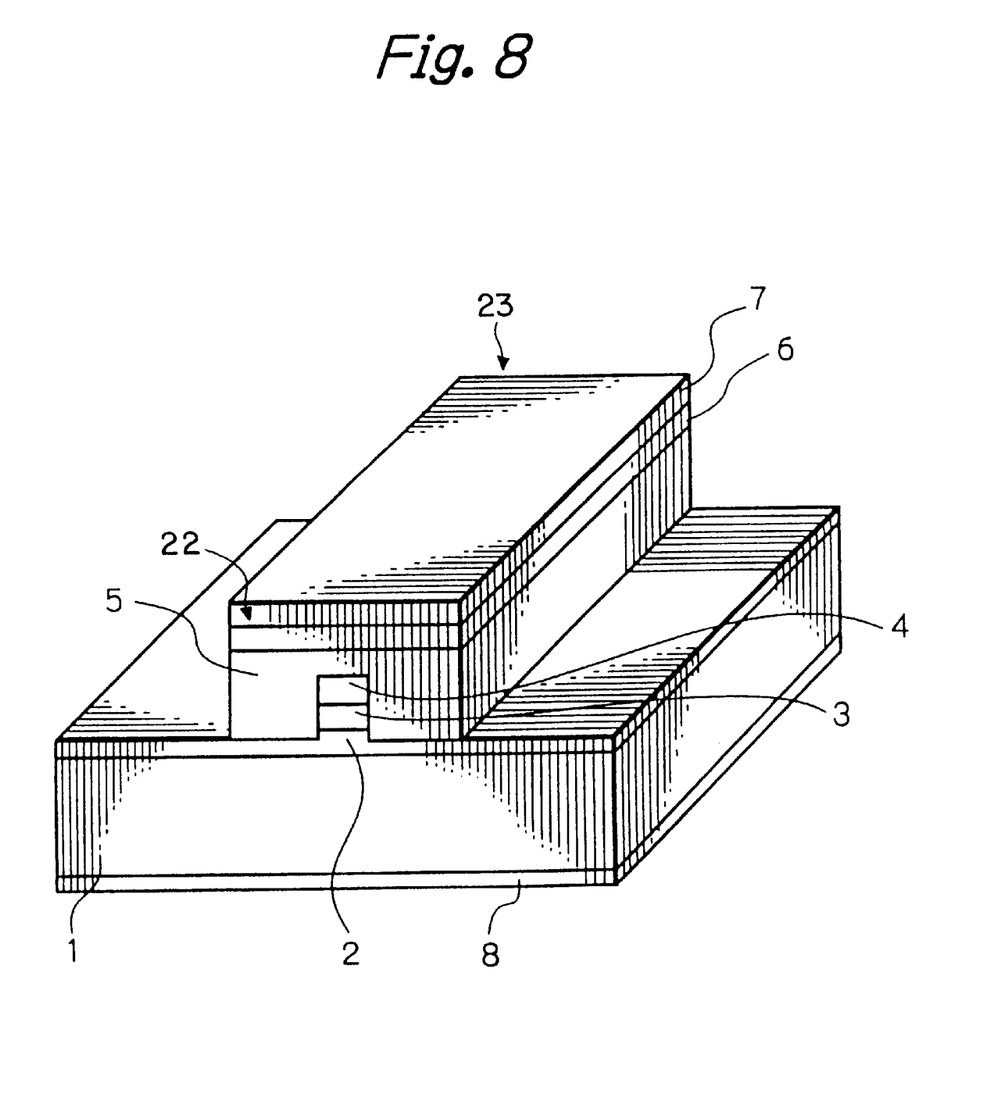

Next, referring to FIG. 8, the back surface of the device is polished, and an n-type electrode 8 and a p-type electrode 7 are formed by using a sputtering process.

Finally, the device is cleaved. Then, an anti-reflection (AR) coating is applied to a facet on the 1-side 22 of the device, and a high reflection (HR) coating is applied to a facet on the N-side 23 of the device.

Now, the characteristic properties of the semiconductor laser device according to the present invention will now be described. A multi-mode waveguide section $S_1$ is formed on the basis of the multi-mode interference (MMI) theorem. The MMI theorem is known and used for designing 1×N or N×N branching/coupling passive optical waveguide (see: Lucas B. Soldano et. al., "Optical Multi-Mode Interference Devices Based on Self-Imaging: Principles and Applications", Journal of Lightwave Technology, Vol. 13, No. 4, pp. 615–627, April 1995).

The equations below can be drawn from the MMI theorem to obtain the MMI length L$\pi$.

$$We=W1+(\lambda_o/\pi)(Nc/Nr)^{2\sigma}(Nr^2-Nc^2)^{-1/2} \quad (1)$$

$$L\pi=4NrWe^2/3\ \lambda_o \quad (2)$$

where L and W1 respectively represent the length and width of an MMI section, Nr represents the refractive index of a waveguiding region and Nc represents the refractive index of a cladding layer, $\lambda_o$ represents the wavelength of an incident beam, and $\sigma$ represents a value equal to $\sigma$=0 in a TE mode and equal to $\sigma$=1 in a TM mode.

According to the MMI theorem, if the following condition (3) is satisfied:

$$L=(3/4N)\ L\pi \quad (3)$$

where N is a positive integer, it is known that the MMI section behaves as a 1×N optical waveguide.

On the basis of the above theorem, it is possible to design a 1×N-MMI optical waveguide where the MMI section provides a multi-mode optical waveguide having a large width but only a single-mode beam (base mode beam) can be transmitted at a facet thereof.

Equations (1), (2) and (3) define the relationship among the length L of the MMI section, the positive integer N and the width W1 of the MMI region. If, for example, the length L of the MMI section is invariable, then it will be understood from equation (3) that the value of L$\pi$ increases as N increases and from equation (2) that the value of We increases as L$\pi$ increases. Additionally, it will be understood from equation (1) that the value of the width W1 of the MMI section increases as We increases. Thus, the width W1 of the waveguide can be increased by raising the value of N.

Figure 9:
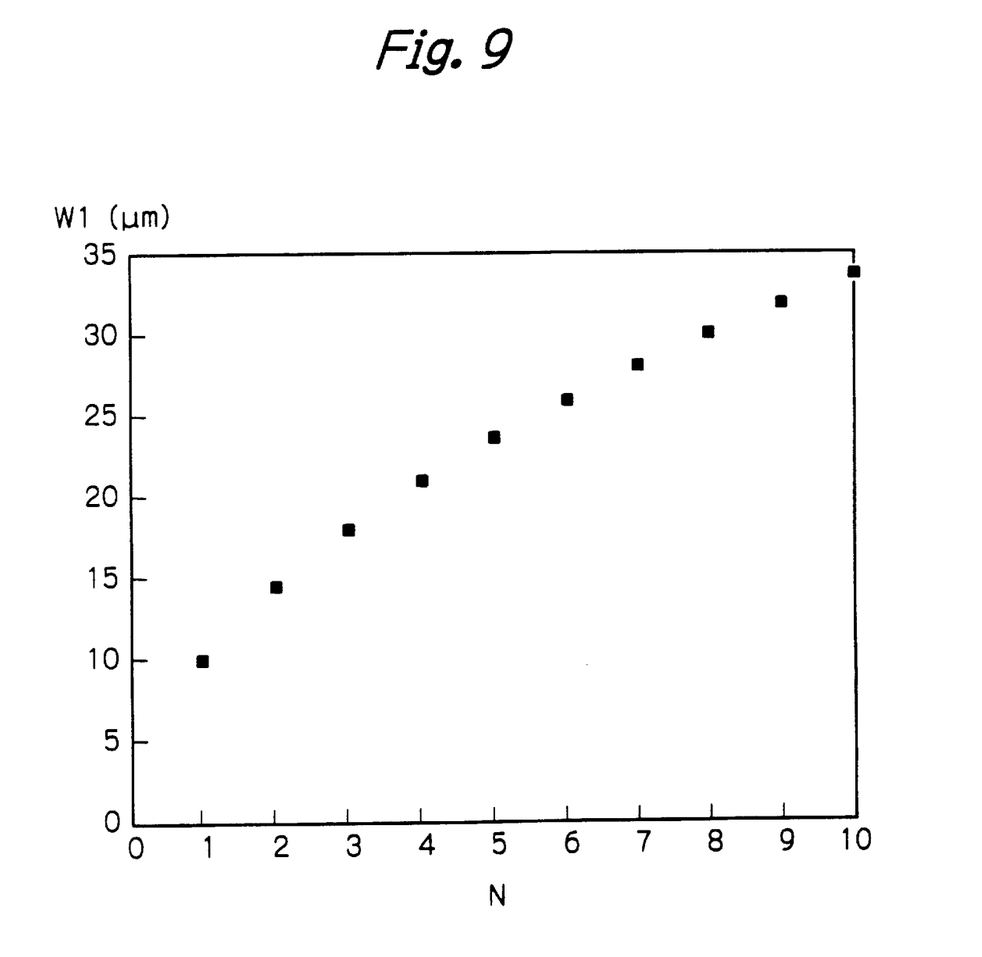
FIG. 9 is a diagram for showing a relationship between N and the width of the MMI region of FIG. 1.

FIG. 9 shows the values of N and the width W1 of the waveguide obtained by calculation when the length L of the MMI section is L=280 $\mu$m. Since N represents a positive integer, W1 will show a discrete value. More specifically, it will be seen that the value of W1 monotonically increases as N increases. Therefore, with the above described design theory, W1 can be increased by raising the value of N by applying a 1×N-MMI waveguide to the waveguide structure of an LD if the length of the device is invariable. Since the restrictions on the saturated injection current are made less rigorous as W1 is increased so that it is possible to obtain a very high optical output level by injecting a large electric current. Note that a 1×3-MMI optical waveguide is used in the embodiment and it will be seen that the width of the waveguide is made as wide as 18 $\mu$m by using a 1×3-MMI optical waveguide.

In a conventional single-mode waveguide having a layered structure like the above embodiment, the width of the waveguide is limited to about 2 $\mu$m over the entire length of the waveguide. In other words, the width of such a waveguide is substantially limited over the entire length of the device to a value equal to the width W2 of the waveguide of the single-mode waveguide section $S_2$ of FIG. 1.

On the other hand, as described above, the above embodiment of the semiconductor laser device is so designed that the LD operates as a 1×3-MMI optical waveguide, so that a single-mode beam can be made available at a facet of the device if the optical waveguide has a width of 18 $\mu$m, which is about 9 times of the width of the conventional single mode waveguide and, at the same time, the device can produce a very high optical output.

Since a 1×N waveguide structure is used for the LD of FIG. 1, the device generates a single-mode beam at one facet and a multi-mode beam at the other facet. Since the LD of FIG. 1 is designed to generate a single-mode beam at one facet of the device, no problem occurs although it generates a multi-mode beam at the other end. More specifically, the facet carrying an HR coating operates as a facet where three single mode waveguides are combined to generate a multi-mode beam, whereas the opposite facet carrying an anti-reflection (AR) coating operates as a facet where a unitary single mode waveguide is provided to generate a single-mode beam. Thus, a desired beam is obtained with a very high output level at the end carrying an AR coating.

Thus, on the basis of the above described theorem, even if a semiconductor laser device includes an MMI section that has a very wide multi-mode optical waveguide, only a single mode beam is generated at a facet thereof with a very high optical output level. Such an LD transforms all the higher order mode beams into a single mode beam to remarkably improve the efficiency of transforming electric energy into optical energy.

The layered structure of the above described embodiment is substantially the same as that of the conventional semiconductor laser device, so that it can be manufactured by using a method of manufacturing the conventional semiconductor laser device. In other words, any established simple manufacturing facility can be used to manufacture the semiconductor laser device according to the present invention at a high manufacturing yield with an enhanced level of reproducibility. Since the semiconductor laser device according to the present invention is structurally simple, it can suitably be used for an integrated optical device.

While the 1×N structure of the above described embodiment is a 1×3 structure, the present invention is by no means limited thereto so long as N represents a positive integer. For example, a 1×4 or 1×5 structure may be used for the purpose of the present invention. While the above described embodiment has a simple buried structure, the present invention is not limited thereto, and therefore, it may alternatively have a double channel planer buried heterostructure (DC-PBH) that shows an excellent current confining effect. While a 1.5 $\mu$m band is selected for the laser wavelength of the above embodiment, the present invention is not limited thereto and a visible light band or a near infrared band may alternatively be used for the purpose of the present invention.

In the above-mentioned embodiment, although an MOVPE process is used for the crystal growth, a molecular beam epitaxy (MBE) process or a metalorganic chemical vapor deposition (MOCVD) process can be used. Also, although an RIE process is described above as being used for forming a mesa structure, a wet etching can be used therefor.

As explained hereinabove, according to the present invention, a single mode output beam can be obtained at an enhanced output level, and also, a low threshold current density and a high efficiency of transforming electric energy to optical energy can be obtained. Additionally, since the semiconductor laser device according to the present invention has a relatively simple structure, such a semiconductor laser device can be manufactured at a high manufacturing yield with an enhanced level of reproducibility.

What is claimed is:

1. A semiconductor laser device for outputting a laser beam in a single transverse mode, comprising an optical waveguide structure including a 1×N (N=2, 3, . . . ) multi-mode interference type optical waveguide section which is optically active, said device having one port at a front facet and N ports at a rear facet, wherein said optical waveguide structure comprises a single-mode optical waveguide section connected to one end of said multi-mode interference type optical waveguide section, and wherein a width of said multi-mode interference type optical waveguide is larger than a width of said single-mode optical waveguide, and the width of said multi-mode interference type optical waveguide relative to that of said single-mode optical waveguide section is increased in accordance with N.

2. A semiconductor laser device comprising:

a first section including a single-mode waveguide and having one port at a front facet of said device;

a second section including N (N=2, 3 . . . ) single-mode waveguides and having N ports at a rear facet of said device; and a third section including a 1×N multi-mode interference type waveguide, which is optically active, having a first end connected to said first section and a second end connected to said second section, wherein a width of said multi-mode interference type waveguide is larger than a width of each of said single-mode waveguides, and the width of said multi-mode interference type optical wavegide relative to that of the single-mode optical waveguide section is increased in accordance with N.

3. A semiconductor laser device comprising:

a first section including a single-mode waveguide and having one port at a front facet of said device;

a second section including N (N=2, 3 . . . ) single-mode waveguides and having N ports at a rear facet of said device;

a third section including a 1×N multi-mode interference type waveguide, which is optically active, having a first end connected to said first section and a second end connected to said second section;

an anti-reflection coating applied to said front facet of said first section; and a high-reflection coating applied to said rear facet of said second section.

4. The device as set forth in claim 3, wherein a width of said multi-mode interference type waveguide is larger than a width of each of said single-mode waveguides.

* * * * *